United States Patent [19]
Cloud et al.

[11] Patent Number: 6,002,613
[45] Date of Patent: *Dec. 14, 1999

[54] DATA COMMUNICATION FOR MEMORY

[75] Inventors: Eugene H. Cloud, Boise; Brett Williams, Eagle; Troy A. Manning, Boise, all of Id.

[73] Assignee: Micron, Technology, Inc., Boise, Id.

[*] Notice: This patent is subject to a terminal disclaimer.

[21] Appl. No.: 08/966,762

[22] Filed: Nov. 10, 1997

Related U.S. Application Data

[63] Continuation of application No. 08/512,326, Aug. 30, 1995, Pat. No. 5,724,288.

[51] Int. Cl.$^6$ ...................................................... G11C 7/00
[52] U.S. Cl. .............................. 365/189.01; 365/189.05
[58] Field of Search ..................... 365/189.01, 189.05, 365/189.08, 233.5, 233

[56] References Cited

U.S. PATENT DOCUMENTS

| | | | |
|---|---|---|---|
| 4,110,842 | 8/1978 | Saruissian et al. | 365/233 |
| 4,794,570 | 12/1988 | Rose et al. | 365/189.08 |
| 4,862,419 | 8/1989 | Hoberman | 365/221 |
| 4,879,693 | 11/1989 | Ferrant | 365/233 |
| 4,891,794 | 1/1990 | Hush et al. | 365/189.04 |
| 5,015,883 | 5/1991 | Waller | 307/465 |
| 5,325,330 | 6/1994 | Morgan | 365/189.05 |
| 5,349,566 | 9/1994 | Merritt et al. | 365/233.5 |
| 5,424,983 | 6/1995 | Wojcicki et al. | 365/189.05 |
| 5,434,823 | 7/1995 | Howard | 365/189.05 |
| 5,513,135 | 4/1996 | Dell et al. | 365/52 |
| 5,724,288 | 3/1998 | Cloud et al. | 365/189.08 |

OTHER PUBLICATIONS

"DRAM 1 Megx4 DRAM 5VEDO Page Mode", *Micron Technology, Inc. 1995 DRAM Data Book*, pp. 1–1 thru 1–30.
"DRAM 2MEGx8DRAM 3.3V, EDO Page Mode", *Micron Technology Inc., 1995 DRAM Data Book*, 1–63 to 1–76, (1995).

*Primary Examiner*—Tan T. Nguyen
*Attorney, Agent, or Firm*—Schwegman, Lundberg Woessner & Kluth P.A.

[57] ABSTRACT

A memory circuit is described which includes memory cells for storing data. The memory circuit can be read from or written to by an external system such as a microprocessor or core logic chip set. The microprocessor provides memory cell address data to the memory circuit and can request that data be output on communication lines for reading therefrom. The memory circuit reduces the time needed to read data stored in the memory by providing a valid output data signal. The valid output data signal indicates that data coupled to the communication lines has stabilized and is therefore valid. Different valid output data signals and trigger circuits for producing the signals are described.

30 Claims, 14 Drawing Sheets

//<br>6,002,613

DATA COMMUNICATION FOR MEMORY

This application is a continuation of U.S. patent application Ser. No. 08/512,326, filed Aug. 30, 1995 now U.S. Pat. No. 5,724,288.

TECHNICAL FIELD OF THE INVENTION

The present invention relates generally to memory circuits and in particular the present invention relates to an output interface used to speed the reading of data from the memory.

BACKGROUND OF THE INVENTION

There are a number of integrated circuit memories commercially available. For example, dynamic memory circuits having memory cells arranged to be accessed in a random fashion are referred to as dynamic random access memories, DRAMs. These memories can be produced in a variety of designs which provide different methods of reading from and writing to the dynamic memory cells. One such method is page mode operations. Page mode operations in a DRAM are defined by the method of accessing a row of a memory cell array and randomly accessing different columns of the array. Data stored at the row and column intersection can be output while that column is accessed. An alternate type of memory access is the extended data output (EDO) memory which allows data stored at a memory array address to be available as output after the addressed column has been closed. Yet another type of operation is included in a burst EDO memory which adds the ability to address one column of a memory array and then automatically address additional columns in a predetermined manner without providing the additional column addresses on external address lines. A more detailed description of a DRAM having EDO features is provided in the "1995 DRAM Data Book" pages 1—1 to 1–30 available from Micron Technology, Inc. Boise, Idaho, the assignee of the present application and is incorporated herein by reference.

DRAMs typically have bidirectional data lines which operate as both data inputs and data outputs. Data is written to the memory circuit using either a strobe signal or a clock. The output of a typical DRAM, however, is not strobed or clocked such that an external system reading the DRAM will not know when valid data is available from the DRAM. That is, an external system reading a DRAM must delay reading the data lines until it is known that valid data is present on the data lines before reading the memory. A time delay is incorporated therefore, after the data read request is signaled to the memory to ensure the reading of valid data from the memory circuit. This time delay may be longer than needed and as a result slows the external system down.

For the reasons stated above, and for other reasons stated below which will become apparent to those skilled in the art upon reading and understanding the present specification, there is a need in the art for a memory circuit which provides a signal that indicates when valid data is available on the output data lines.

SUMMARY OF THE INVENTION

The above mentioned problems with efficient and rapid reading of data from a memory circuit and other problems are addressed by the present invention and which will be understood by reading and studying the following specification. An integrated memory circuit is described which has a valid data output signal that indicates when valid data is available on the data output lines.

In particular, the present invention describes an integrated circuit memory comprising memory cells for storing data, an output communication means for outputting the data stored in the memory cells, and output signal means for indicating that valid data is available from the output communication means. In one embodiment, the output signal means can comprise an output signal connection, and a trigger circuit coupled to the output signal connection for producing an output data strobe signal.

The output data strobe signal can be any configuration, for example an active low pulse, or an active high pulse, or even a signal which toggles when valid data is available from the output communication means. One trigger circuit comprises a pull-up circuit for selectively pulling the output data strobe signal high, a pull-down circuit for selectively pulling the output data strobe signal low, and an enable circuit coupled to the pull-up circuit and the pull-down circuit for activating either the pull-up circuit or the pull-down circuit. The enable circuit can be responsive to an external signal, or the output communication means.

In an alternate embodiment, an integrated memory circuit comprises randomly addressable memory cells for storing data, a plurality of data output lines, a buffer circuit for coupling the data stored in the randomly addressable memory cells to the plurality of data output lines in response to an external data request signal, and a trigger circuit which produces a signal indicating that the data coupled to the plurality of output data lines is valid. The integrated circuit memory can be a dynamic random access memory circuit (DRAM). Alternatively, the integrated circuit memory can be a dynamic random access memory circuit which operates as a burst extended data output (BEDO) memory, clocked BEDO memory, or a synchronous DRAM.

In yet another embodiment, a method is provided for reading a memory circuit. The method comprises the steps of receiving an external signal requesting data output from the memory circuit, coupling data stored in the memory circuit to output communication lines, and generating an output data strobe signal to identify when the data coupled to the output communication lines is valid. The method can further include the steps of receiving the output data strobe signal by a microprocessor or core logic chip set, and latching the valid data coupled to the output communication lines.

DETAILED DESCRIPTION OF THE INVENTION

In the following detailed description of the preferred embodiments, reference is made to the accompanying drawings which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present inventions. The following detailed description is, therefore, not to be taken in a limiting sense, and the scope of the present inventions is defined only by the appended claims.

This invention concerns electrical circuitry which uses voltages to represent the two binary logic levels. The words "low" and "high" in this specification refer generally to the false and true binary logic levels, respectively. Signals are generally considered active when they are high, however, an asterisk (*) following the signal name, or a bar above the signal name in this application indicates that the signal is negative or inverse logic. Negative or inverse logic is considered active when the signal is low.

Figure 1:
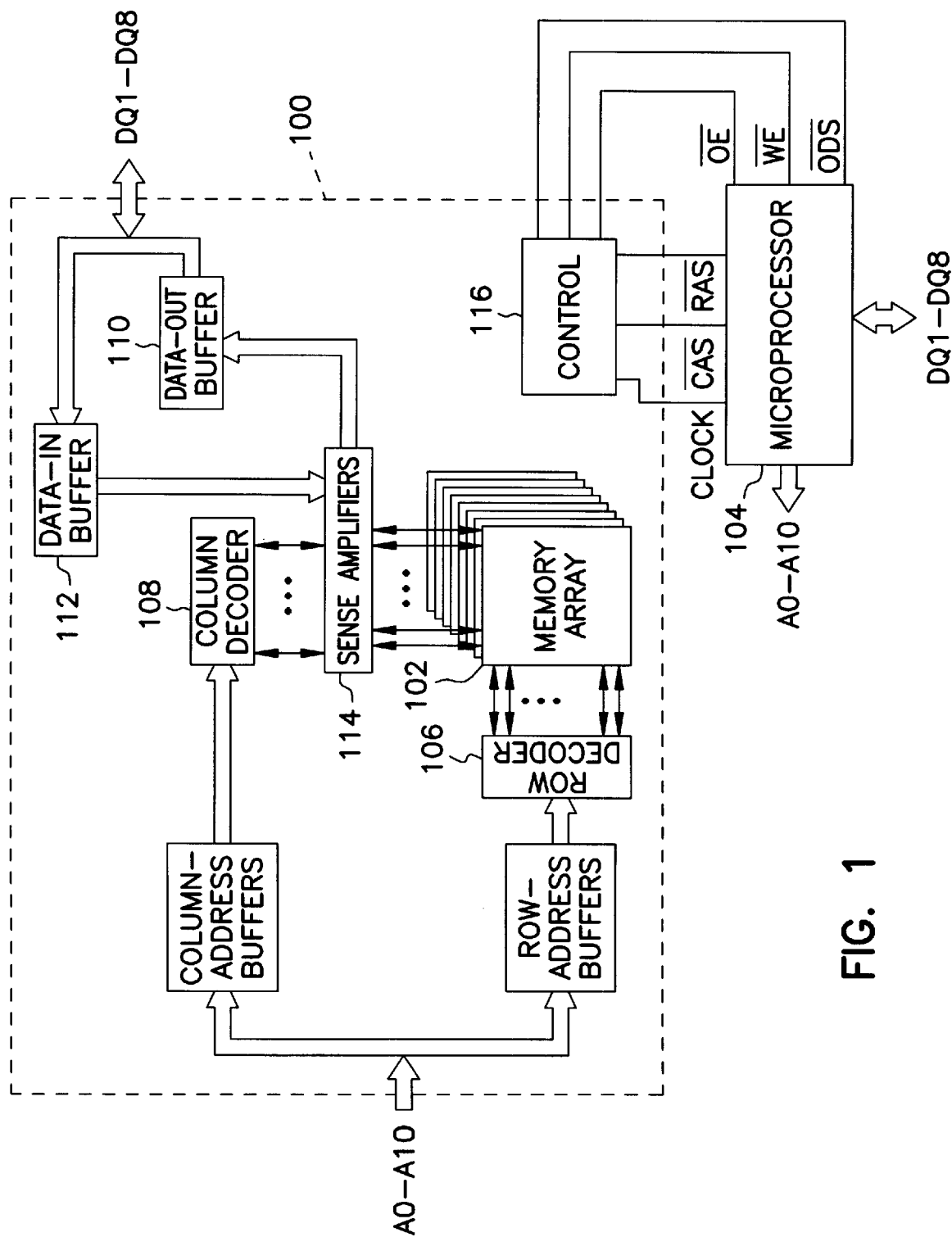
FIG. 1 is a block diagram of a memory circuit incorporating the present invention.

A DRAM 100 is described in reference to FIG. 1 as having a memory array 102 and associated circuitry for reading from and writing to the memory array. The DRAM array is a 2048 by 1024 by 8 bit memory cell array which can be accessed by a microprocessor 104 or other external system through input/output connections including address lines A0–A10. Conceptually, there are eight planes of memory cells in the array, such that one address in each plane are used in combination as one 8-bit word. Row decoder 106 decodes a row address from an address signal provided on A0–A10, and addresses the corresponding row of the DRAM array. Likewise, column decoder 108 decodes a column address from an address signal provided on A0–A10, and addresses the corresponding column of the DRAM array. Data stored, in the DRAM array can be transferred to outputs DQ1–DQ8 through the data output buffer 110. Likewise, data input buffer 112 is used to receive data from DQ1–DQ8 and transfer the data to the DRAM array. Sense amplifier circuitry 114 is provided to sense and amplify data stored on the individual memory cells of the DRAM array. Control circuitry 116 is provided to monitor the memory circuit inputs and control reading and writing operations.

The input and output connections of the DRAM 100 used to communicate with the microprocessor 104 are described as follows. Output enable (OE*) enables the output buffer 110 of the DRAM. Write enable (WE*) is used to select either a read or write operation when accessing the DRAM. Row address strobe (RAS*) input is used to clock in the eleven row address bits. Column address strobe (CAS*) input is used to clock in the ten column address bits. Address input lines A0–A10 are used to identify a row and column address to select at least one 8 bit word or register out of the 2,097,152 available words, as detailed above. DRAM data input/output lines DQ1–DQ8 provide data input and output for the DRAM. An optional clock signal can be provided by the microprocessor as described below for operating the memory circuit in a synchronous mode.

It will be understood that the above description of a DRAM is intended to provide a general understanding of the memory and is not a complete description of all the elements and features of a DRAM. Further, the present invention is equally applicable to any size and type of memory circuit and is not intended to be limited to the DRAM described above. For example, the present invention can be included in multi-port memories similar to the memory described in U.S. Pat. No. 4,891,794 issued to Hush et al. entitled "Three Port Random Access Memory" which is incorporated herein by reference. Multi-port random access memories (RAM) are substantially faster than standard RAM and commonly referred to as video random access memories (VRAM) because of their effectiveness in video systems.

Data stored in the memory array 102 of a DRAM 100 can be read using several different types of read operations. The most common is the page mode read. Page mode operations refer to the method of accessing one row of the DRAM array and then randomly addressing different columns of that row. That is, a "page" is defined by a row plane which intersects all eight planes of the array. Any 8-bit "word" located on a page can be accessed by selecting a column of the array.

Figure 2:
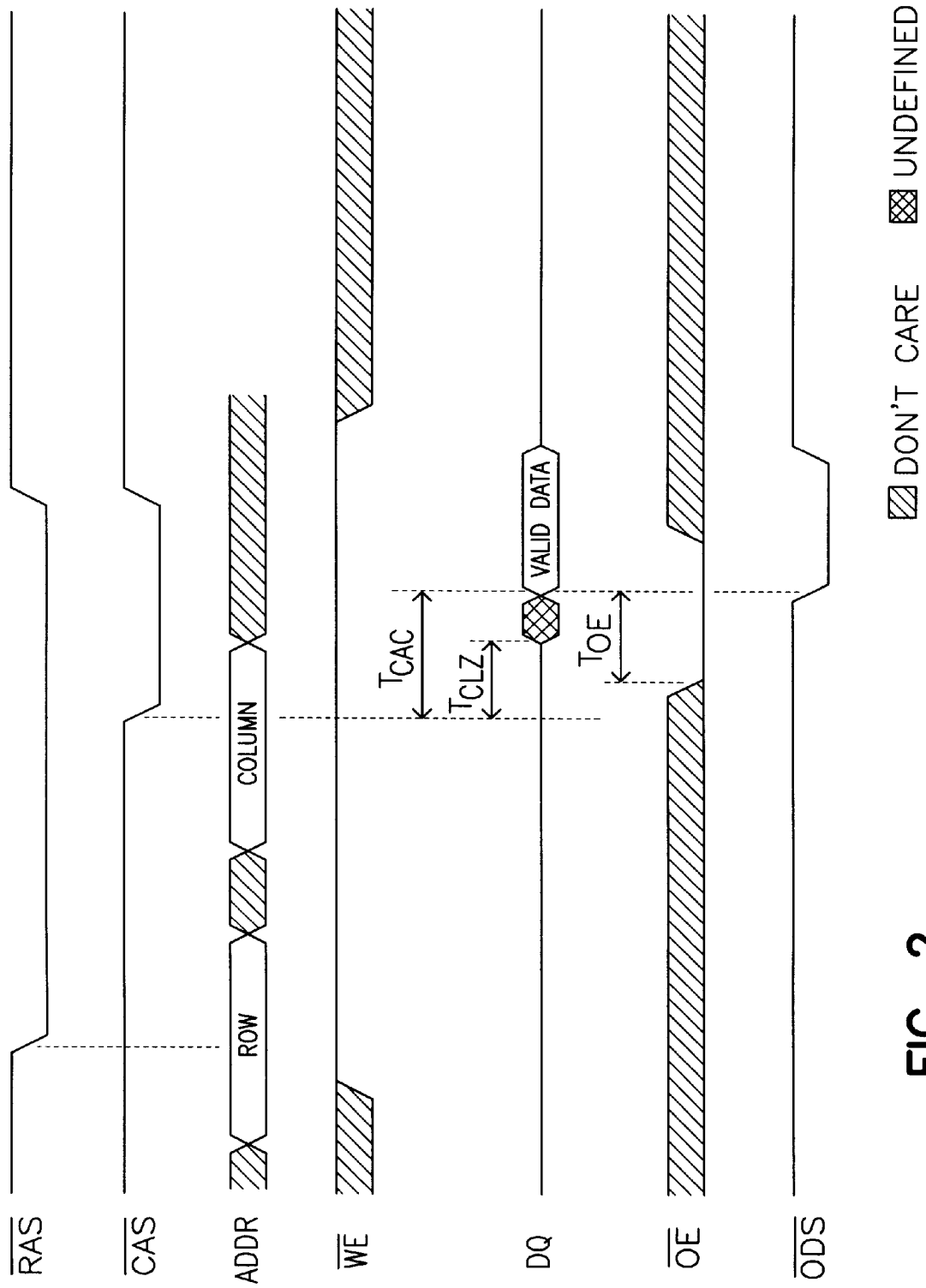
FIG. 2 is a timing diagram of a page mode read operation.

FIG. 2 illustrates the timing of a page mode read operation in a DRAM. To read data from the array, the RAS* signal must go low to initiate an access of the memory array. The RAS* signal not only enables a page mode operation, but is used to strobe address lines A0–A10 for the address of the row which is to be accessed. The row identified by the data present on the address lines is then addressed, as known to one skilled in the art. After a row has been addressed, the data on the address lines is changed to identify the column of the row which is to be accessed. Only ten of the address lines are used to identify one of the available 1024 columns. On the falling edge of CAS*, the address lines are strobed and the identified column is accessed, as known to one skilled in the art. The CAS* signal is also used by the control circuitry to determine if a read or write operation is to be performed on the memory cells located at the addressed row and column. The control circuitry 116 evaluates the WE* line on a falling edge of the CAS*signal. If the WE* line is high a read operation is to be performed, and a write operation is conducted if the WE* line is low.

To read the data located at the addressed row and column, memory cells in each of the eight planes of the array must be accessed and the data coupled to the DQ lines via the output buffer. The output buffer circuit 110 is enabled when OE* goes low. The time required to couple the data stored on the addressed memory cells to the output buffers, therefore, is specified by time $t_{CLZ}$ following the CAS* falling edge. Although the data stored in the addressed memory cells is coupled to the DQ lines by $t_{CLZ}$, the validity of the data on the DQ lines depends upon loading. That is, the state of each individual DQ line will begin to transition to the appropriate voltage level following $t_{CLZ}$ but will not complete the transition immediately. The transition time for a given DQ line is directly dependent upon the load placed upon the DQ line; the heavier the loading, the longer the transition time. The time needed to insure that the transition is complete such that all DQ lines represent valid data is typically specified as $t_{CAC}$ and is specified as a maximum time following the falling edge of CAS*.

In a typical operation, the OE* line is low prior to coupling the memory cells to the output buffers. However, the OE* line can go low later in the cycle to turn on the output buffers. The maximum time needed to insure that the DQ lines have made a full transition to their correct state is typically specified as time toE following the falling edge of the OE* line. This time is specified by the manufacturer as a maximum transition time, regardless of load levels. Again, the speed in which valid data is available on the DQ lines is directly dependent upon the loading of the DQ lines.

To read data from the DRAM, the microprocessor 104 must be programmed to wait until both time $t_{CAC}$ and $t_{OE}$ have passed to insure that valid data is available on the DQ lines. This time delay is a worst case scenario and could be reduced if an output data strobe signal (ODS) is incorporated to indicate when the data on the DQ lines is valid. The ODS* signal is provided as an output connection from the control circuitry 116 to the microprocessor so that the microprocessor has a way of identifying when valid data is available. Unnecessary time delays can, therefore, be eliminated from a read operation.

An active low ODS* signal shown in FIG. 2 goes low when the data on the DQ lines is valid. The microprocessor can use the falling edge of the ODS* signal to latch the data present on the DQ lines. Different embodiments of circuitry which can be used to generate different ODS signals are described in detail below. These include active low and active high ODS signals, and an ODS signal which toggles when valid data is present on the DQ lines. Provisions are also provided to allow wire OR circuit connections to be made external to a single DRAM chip. This allows one chip in a system to signal when all DQ's in the system are valid over a single ODS* line. The DRAM 100 of FIG. 1 can be manufactured to operate in modes other than page mode. For example, the control circuit 116 can be used to allow extended data output (EDO), burst EDO, SDRAM, or clocked BEDO operations.

The primary difference between an EDO memory and the above described DRAM having a page mode read is that the data remains available on the DQ lines after the CAS* line goes high. DRAMs operating in a page mode traditionally turn the output buffers off with the rising edge of CAS*. EDO DRAMs operate similar to page mode DRAMs, except data remains valid or becomes valid after CAS* goes high during read operations, provided RAS* and OE* are held low. If OE* is pulsed while RAS* and CAS* are low, the DQ lines will toggle from valid data to a tri-state and back to valid data. If OE* is toggled or pulsed after CAS* goes high while RAS* remains low, data will transition to and remain tri-state. A more detailed description of a DRAM having EDO features is provided in the "1995 DRAM Data Book" pages 1–63 to 1–76 available from Micron Technology, Inc. Boise, Idaho, the assignee of the present application, and is incorporated herein by reference.

In general, burst operation in an EDO memory allows the microprocessor to specify an initial column address on the address lines and access a number of different columns without providing additional external column addresses. This is accomplished by allowing the control circuitry 116 to internally change the column address in a predetermined pattern on successive CAS* cycles. Data can, therefore, be read from the memory array 102 by providing a first column address on a first CAS* cycle and then merely toggling CAS*. This allows a "burst" of different data to be output on the DQ lines. It will be seen that this method of reading data from the memory is substantially faster than page mode or EDO operations by eliminating the need to provide new column addresses for each of the different columns accessed. The length of the burst can be varied, as known to one skilled in the art.

A burst write operation can also be performed. This operation allows an initial column address to be loaded from the address lines on a first CAS cycle so that data provided on the DQ lines can be written to that column of the addressed memory row. On successive CAS* cycles, the data on the DQ lines is written to different column addresses.

Figure 3:
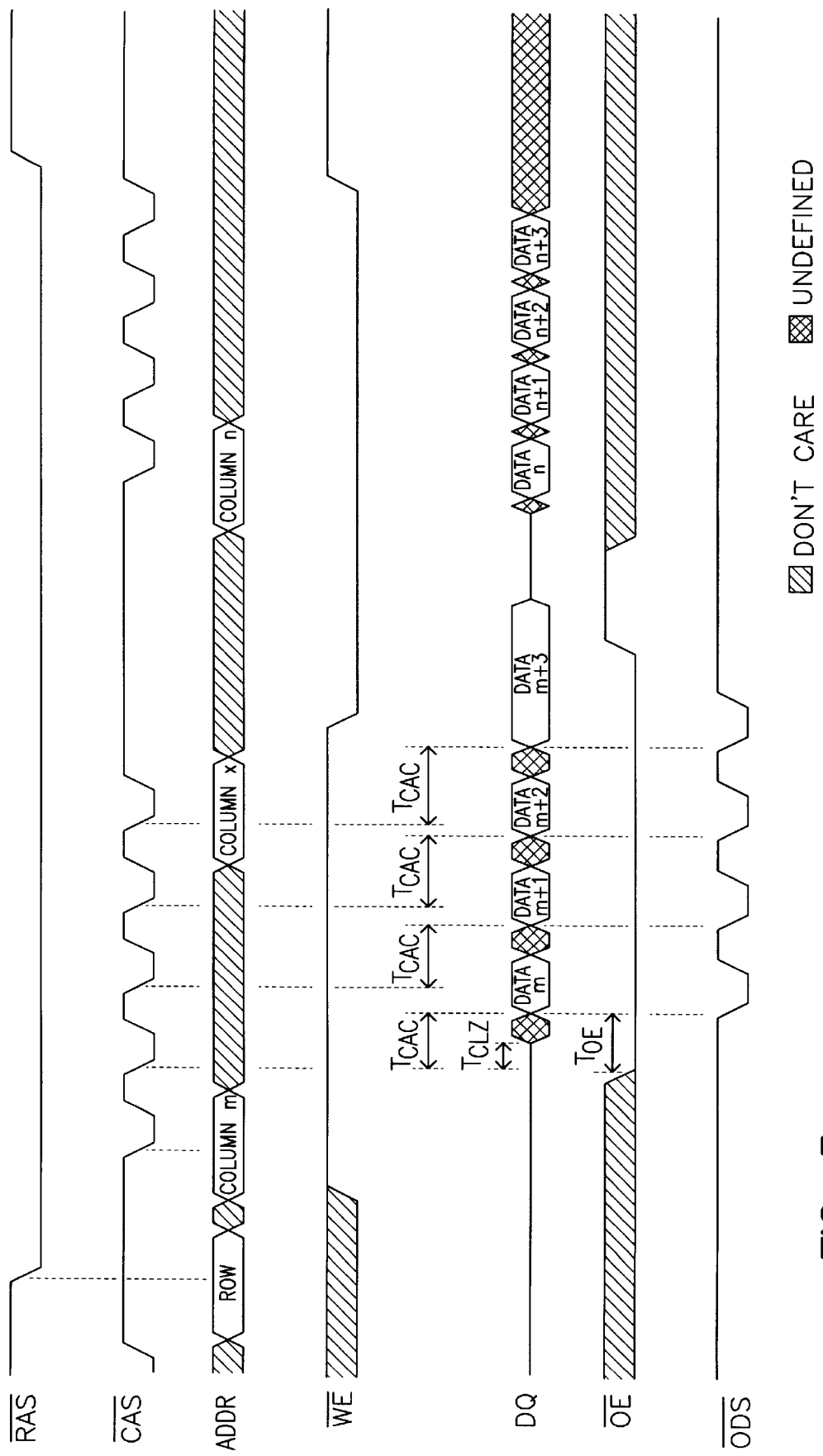
FIG. 3 is a timing diagram of a burst EDO read/write operation, with an active low output data strobe.

FIG. 3 illustrates a burst read operation followed by a burst write operation in a memory circuit 100 incorporating the present invention. A row address is first provided on the address lines and used to address a row of the memory array on the falling edge of RAS*. The first CAS* cycle following the falling edge of RAS* is used to read column address m and read the WE* line using the control circuitry 116. WE* is high on the first CAS* cycle, thereby, specifying that a read operation is to be performed. On the next CAS* cycle the memory cells located at column address m are accessed and the data stored on the memory cells is coupled to the DQ lines. As explained above, the DQ lines are not guaranteed to contain valid data until time $t_{cac}$ following the falling edge of CAS* or time toE following the falling edge of OE*. On the next CAS* cycle, data from column address m+1 is coupled to the DQ lines. Because the DQ lines may change states, valid data m+1 cannot be guaranteed to be present on the DQ lines until a new time $t_{CAC}$ has passed. Similarly, data m+2, and m+3 are output on the DQ lines on the next two CAS* cycles. During a burst operation the address lines are ignored. Column address x provided on the address lines, therefore, is ignored on the fifth CAS* cycle. Data m+3 remains available on the DQ lines until a time period following the rising edge of OE*.

The first CAS* cycle after the WE* line goes low is used to write data to column address n. In a burst write operation, data is written to different column addresses on successive CAS* cycles. Data n+1, n+2, and n+3 provided on the DQ lines, therefore, are written to different column addresses.

Figure 4:
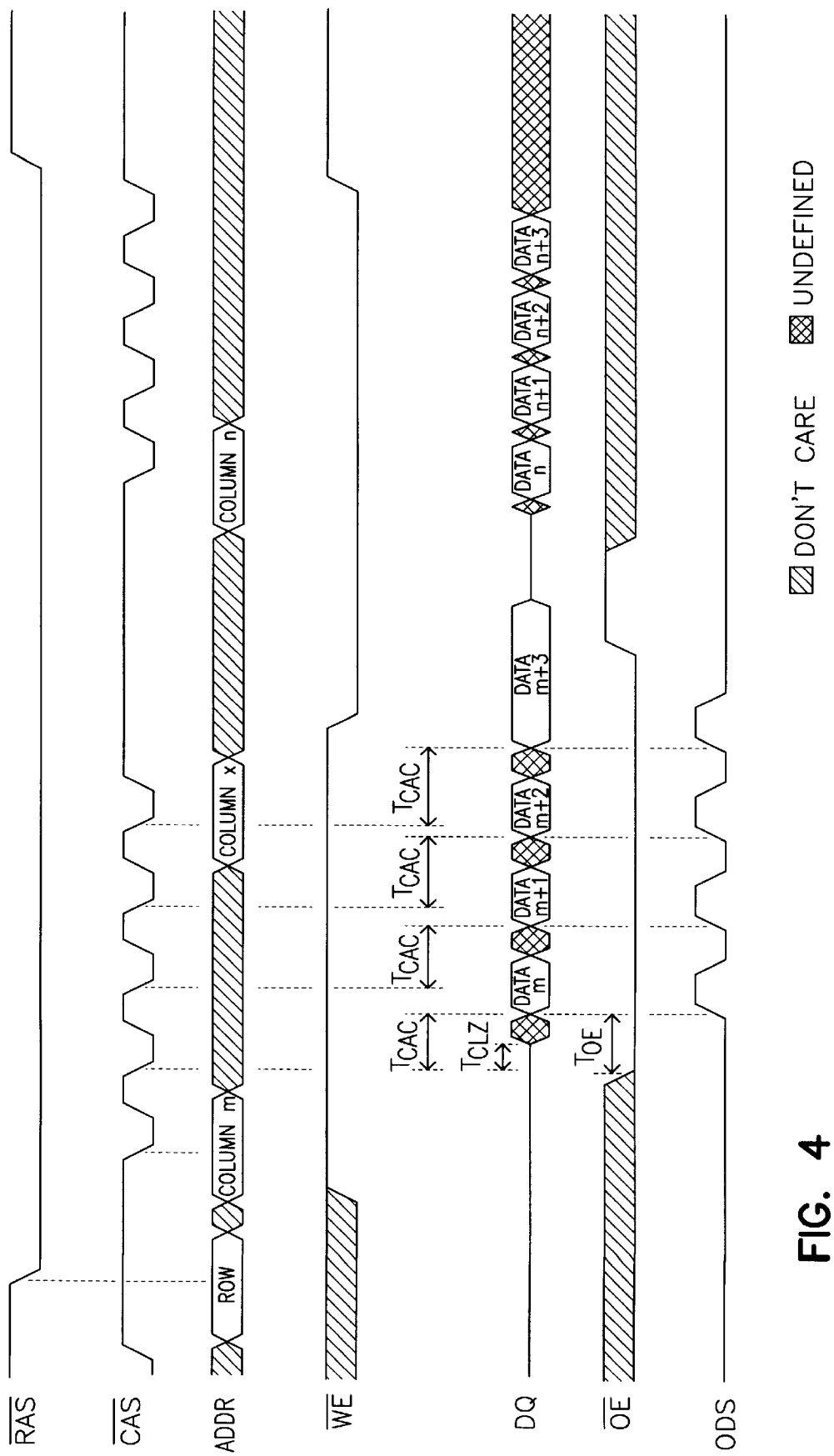
FIG. 4 is a timing diagram of a burst EDO read/write operation, with an active high output data strobe.
Figure 5:
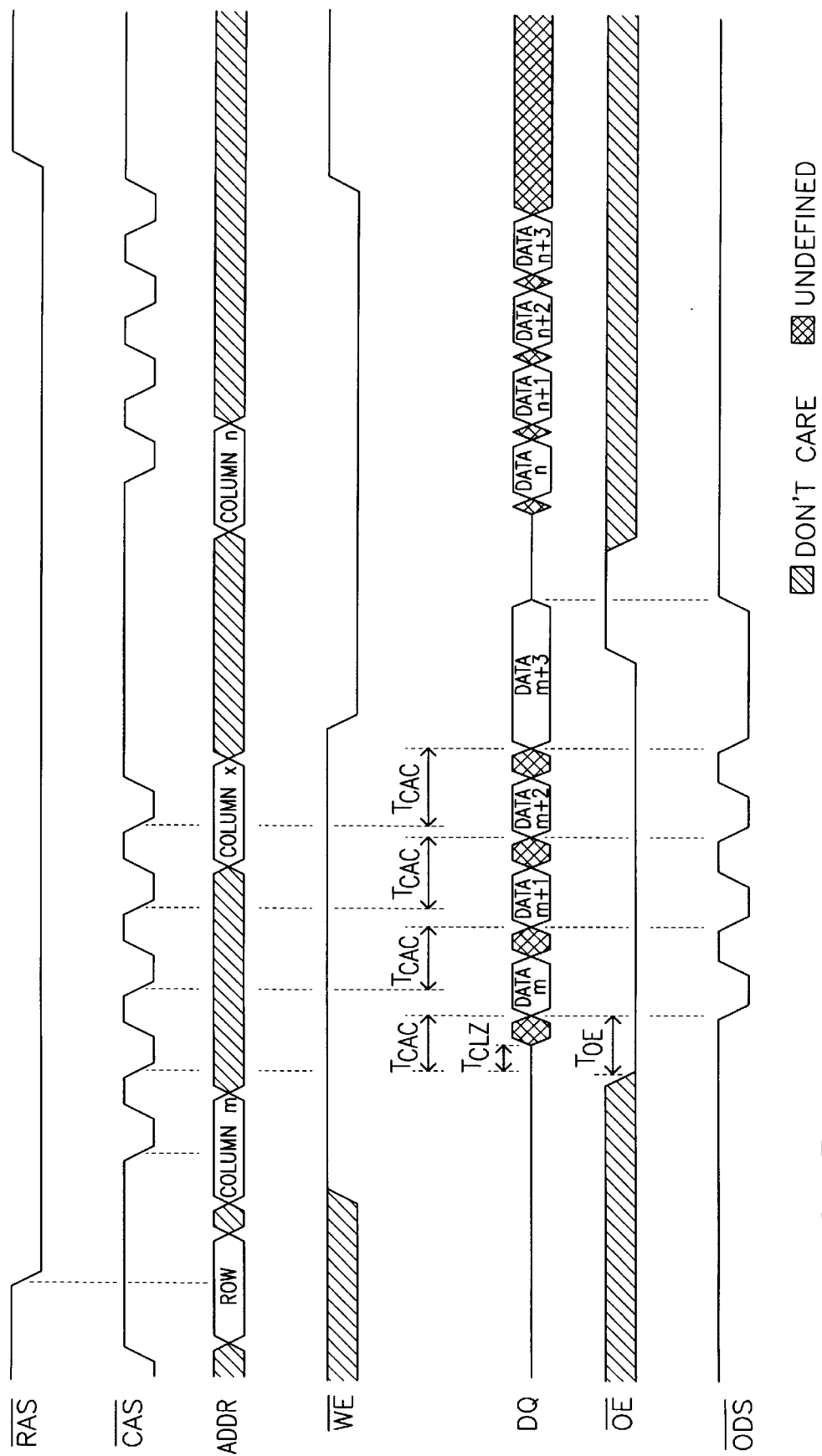
FIG. 5 is a timing diagram of a burst EDO read/write operation, with an extended active low output data strobe.

During the burst read operation the ODS* line toggles low during the time in which valid data is present on the DQ lines. $T_{CAC}$ is a worst case situation and valid data may be available prior to time $t_{CAC}$ if the DQ lines are not heavily loaded. The microprocessor, therefore, does not have to wait until time $t_{CAC}$ has passed to read the output lines, but can read the data as soon as the ODS* goes low. The signal used to notify the microprocessor of the presence of valid data is not limited to a active low pulse but can be an active high pulse as seen in FIG. 4. Further, the ODS* signal can be either a pulse of a predetermined length or an active signal during the entire time that valid data is present on the DQ lines as illustrated in FIG. 5.

Figure 6:
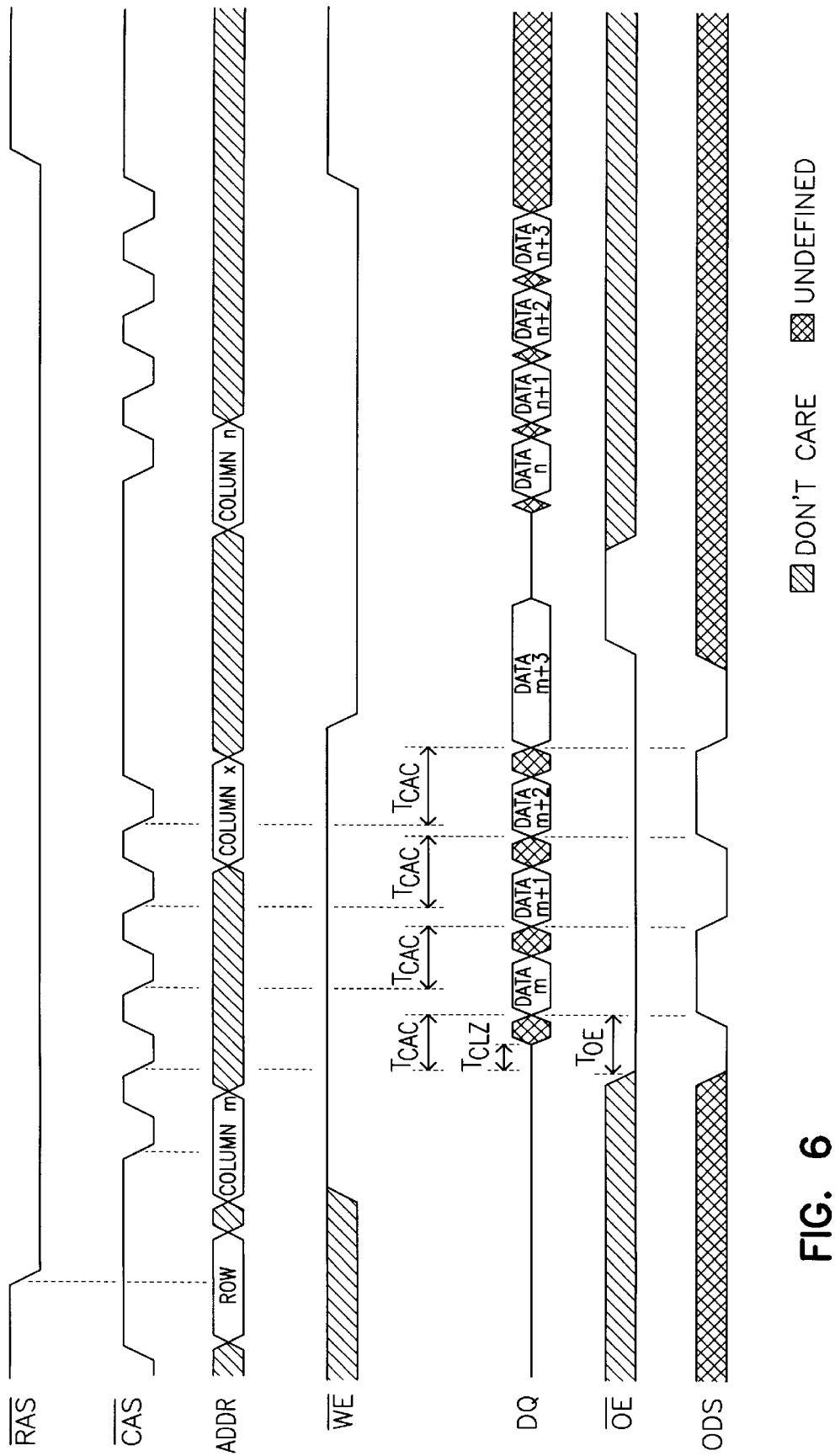
FIG. 6 is a timing diagram of a burst EDO read/write operation, with an output data strobe which toggles at each new data transition.
Figure 7:
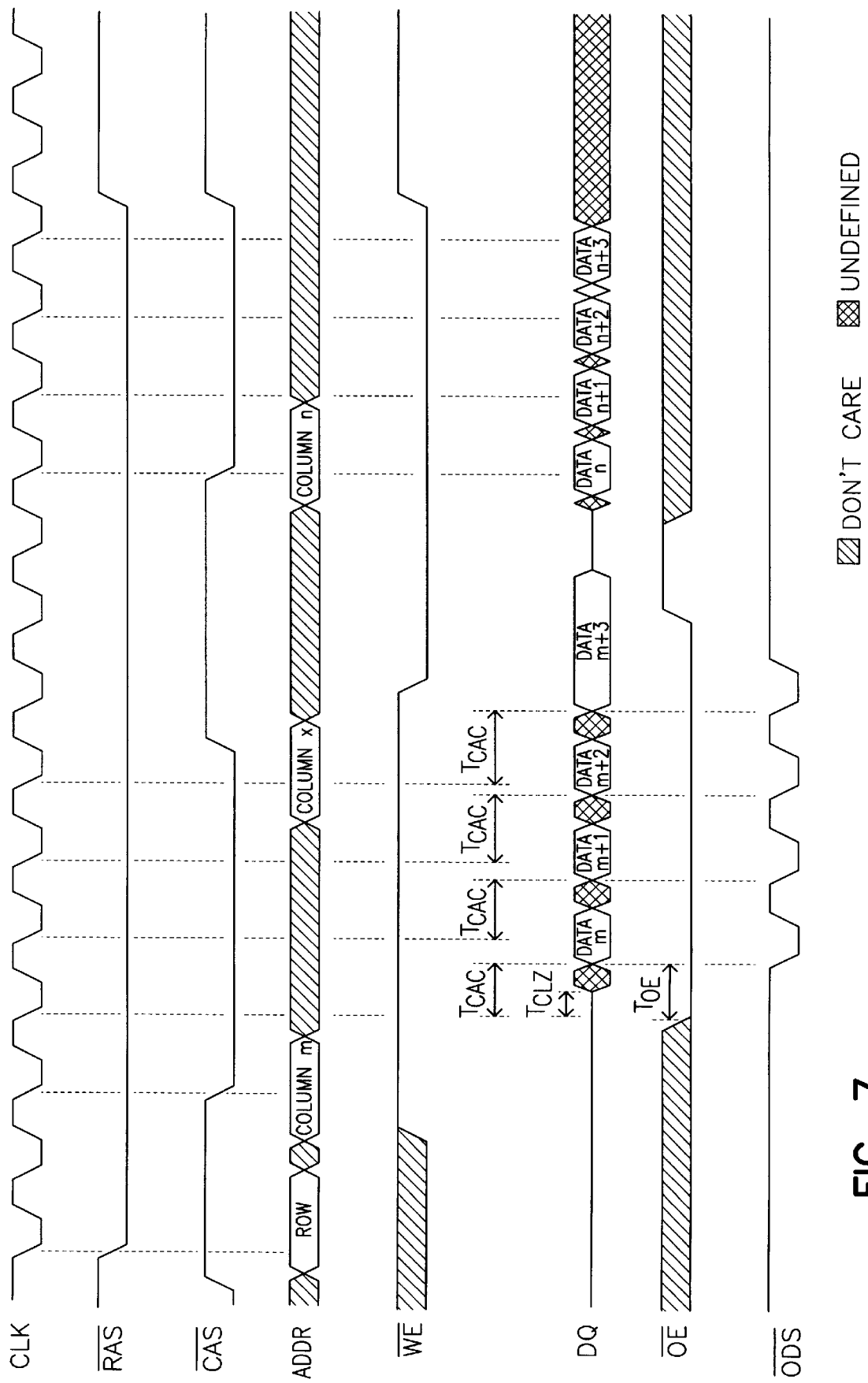
FIG. 7 is a timing diagram of a clocked burst EDO read/write operation, with an active low output data strobe.
Figure 8:
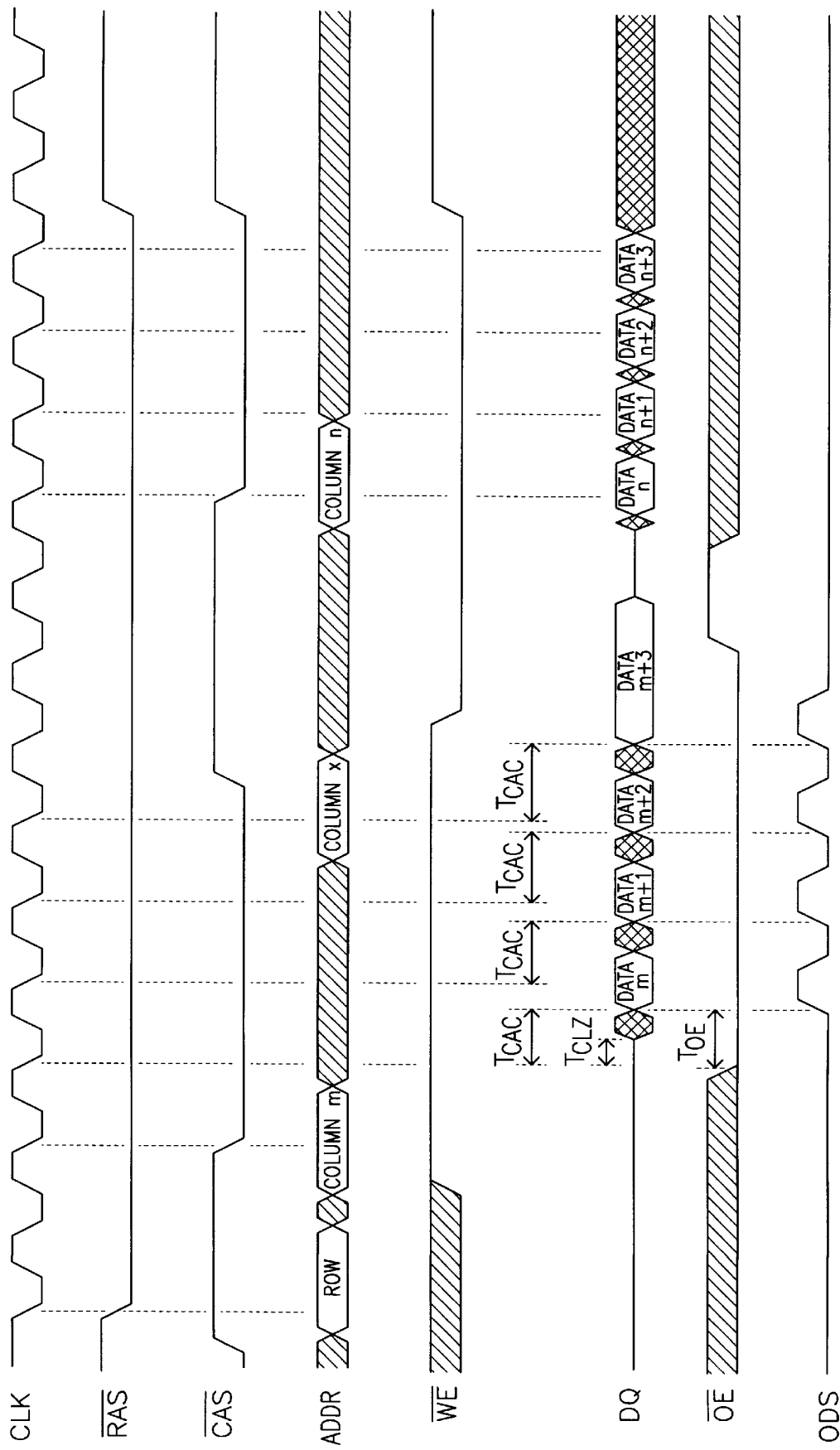
FIG. 8 is a timing diagram of a clocked burst EDO read/write operation, with an active high output data strobe.
Figure 9:
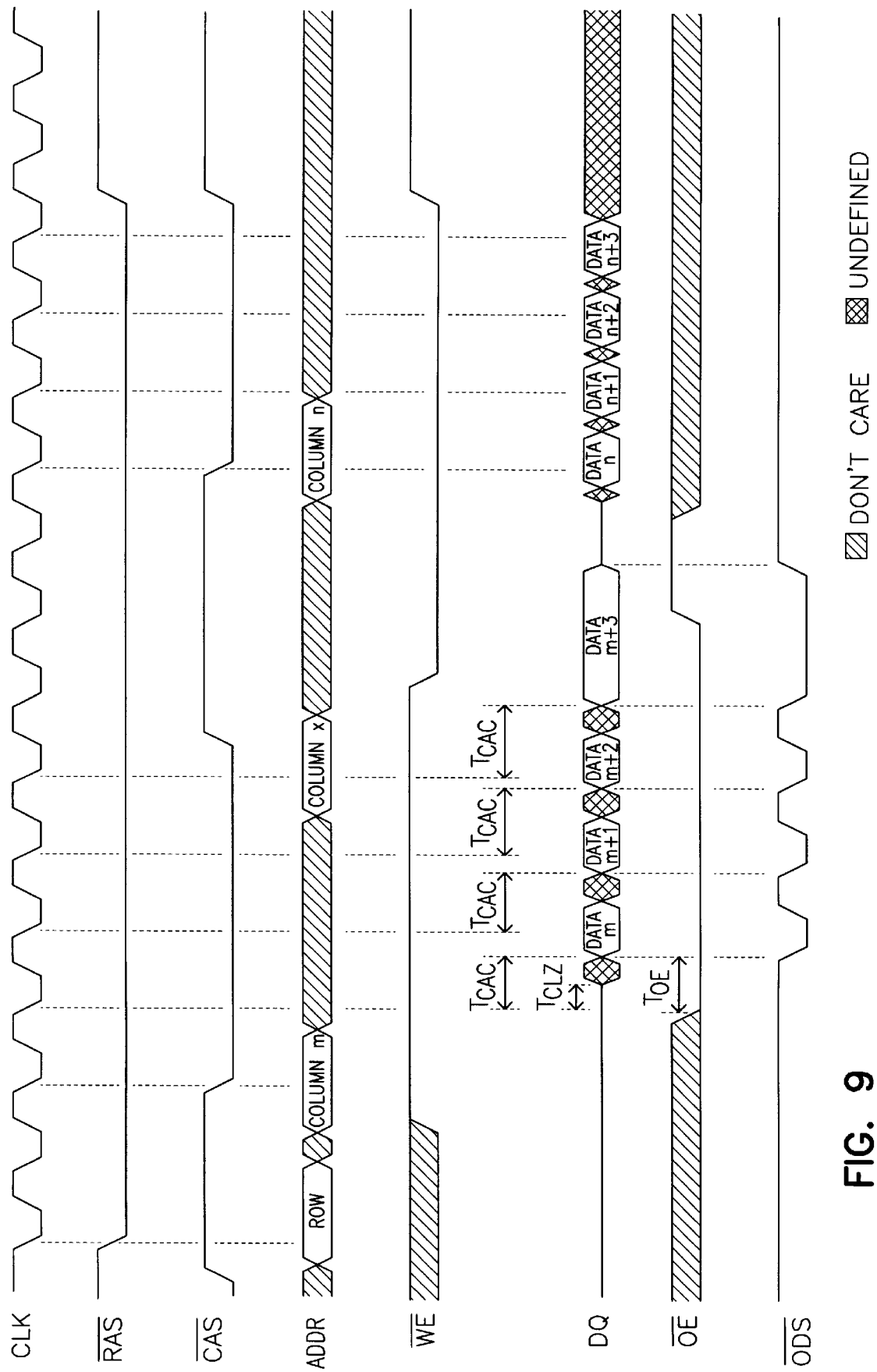
FIG. 9 is a timing diagram of a clocked burst EDO read/write operation, with an extended active low output data strobe.
Figure 10:
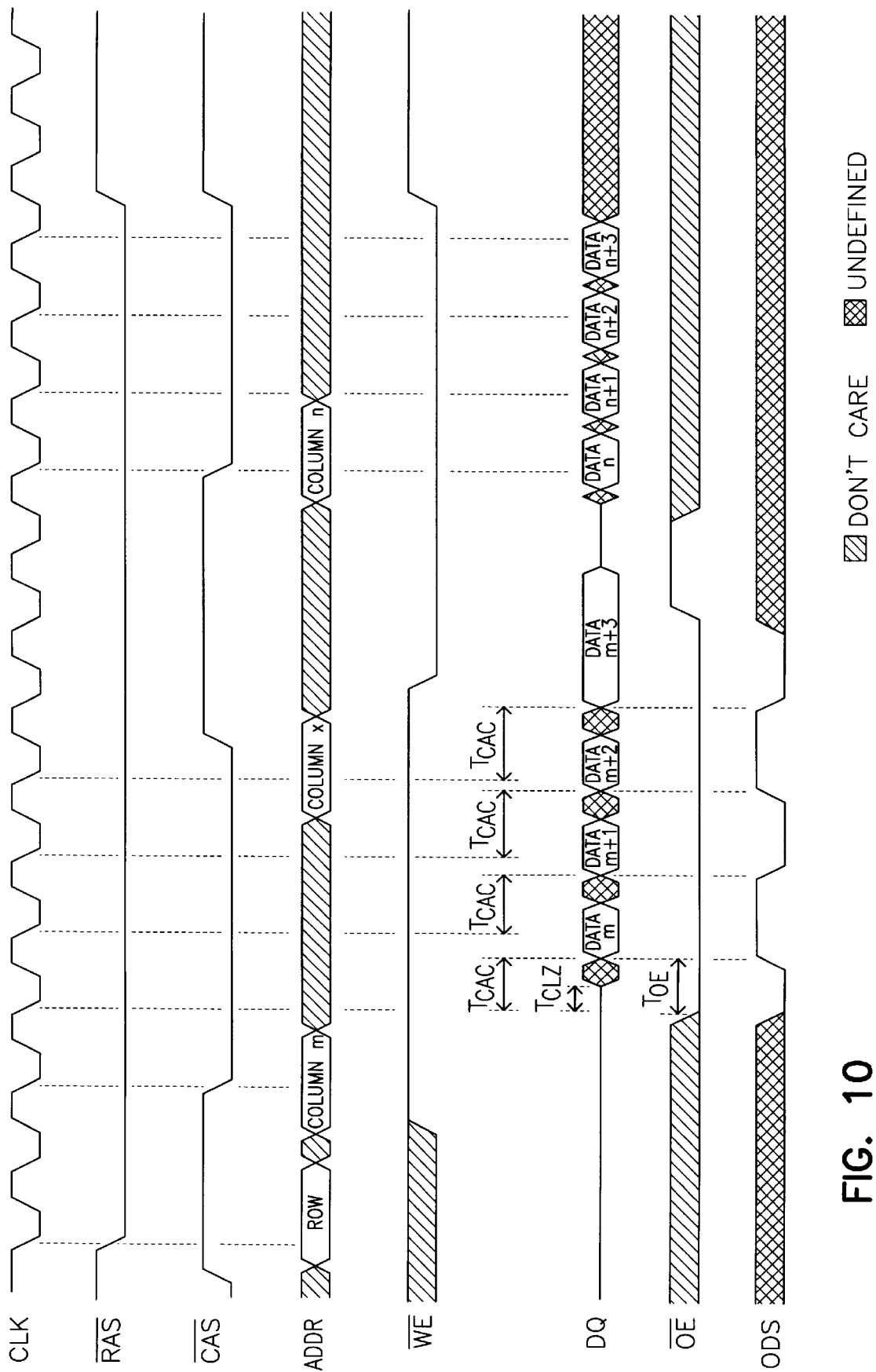
FIG. 10 is a timing diagram of a clocked burst EDO read/write operation, with an output data strobe which toggles at each new data transition.

Alternatively, an ODS signal can be provided which toggles states each time new valid data is presented on the DQ lines. This ODS signal, therefore, can operate at a lower frequency than an ODS which pulses every time new valid data is available. FIG. 6 illustrates an ODS signal which toggles when valid data is available on the DQ lines. The ODS signal is illustrated as starting at a low state and toggling high with data m, but can start at a high state and toggle low with data m. That is, the initial state of the ODS line is unknown, as explained below, but will toggle with the validity of the DQ lines. The microprocessor, therefore, can monitor the ODS* signal for both low to high and high to low transitions to latch the data on the DQ lines.

FIGS. 7–10 illustrate different synchronous or clocked BEDO operations as explained above in reference to FIGS. 3–6. The ODS* signals shown in FIGS. 7–10 are same state and length as those shown in FIGS. 3–6 but are generated using the optional clock signal provided by the microprocessor, shown in FIG. 1. The clock signals shown in the figures are used to synchronize input and output data in place of the CAS* signal. That is, the clock signal is used to advance the address location in the BEDO mode in place of cycling the CAS* line. The CAS* signal, therefore, is cycled low once to load the starting column address and remains low while the burst operation is performed. The falling edge of the clock signal is used to advance the internal column address and couple data to or from the DQ lines. CAS* is a loaded line, and this option eliminates the need to toggle CAS* at a high frequency. Thus, access time can be reduced.

The above described output data strobe signals are used to allow the microprocessor to read valid data from the output data lines, DQ, in a faster manner than was previously possible. Data is considered valid when the data signal has stabilized to a pre-determined level such that it is no longer in transition. In operation, the microprocessor, or other external system, provides a request to the memory circuit for data output. In a DRAM this request is typically in the form of a CAS* signal. Instead of waiting a predetermined time period following the CAS* signal before reading the output data lines, as required with prior art DRAMs, the microprocessor can read the data output lines as soon as the output data strobe signal triggers. Several different embodiments of trigger circuits which can be used to produce the output data strobe signal are detailed below.

Figure 11:
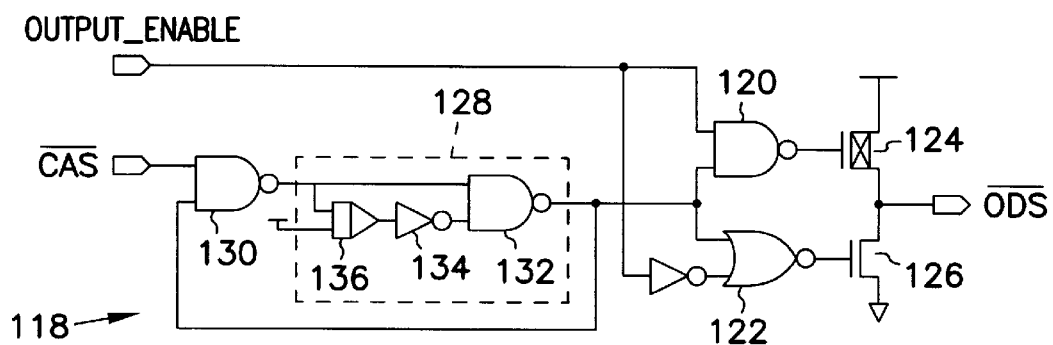
FIG. 11 is a schematic diagram of a trigger circuit for producing the output data strobe of FIG. 3.
Figure 12:
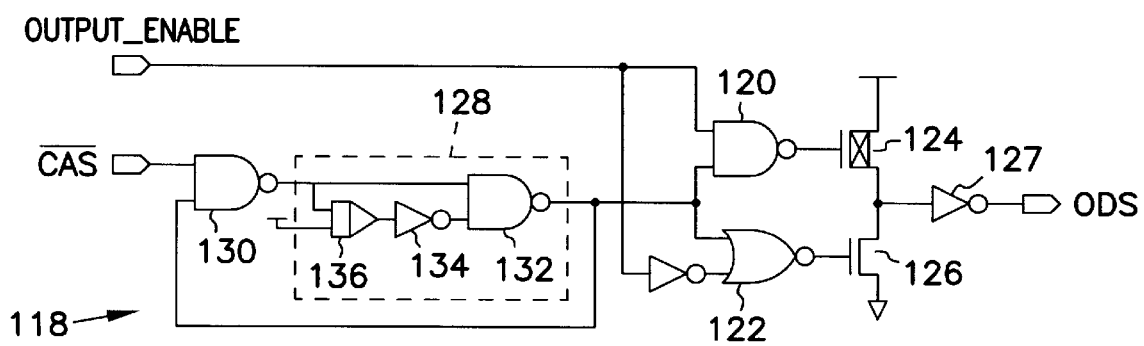
FIG. 12 is a schematic diagram of a trigger circuit for producing the output data strobe of FIG. 4.

FIG. 11 shows a schematic of a trigger circuit 118 which can be used to provide an active low pulse for the ODS* signal. The trigger circuit comprises a NAND gate 120 and a NOR gate 122 which selectively activate pull-up p-channel transistor 124 and pull-down n-channel transistor 126, respectively. Transistors 124 and 126 are commonly referred to as a push-pull output. The NAND gate has an input coupled to an output_enable signal which is at a high voltage when the output buffers are turned on. Output_enable is basically the inverse of OE*. The other input to NAND gate 120 is the output of pulse generator circuit 128 which produces a low pulse when the output of NAND gate 130 transitions from a low voltage to a high voltage level. The inputs of the NOR gate 122 are coupled to the inverse of the output_enable signal and the output of the pulse generator circuit 128. The pulse generator circuit includes a NAND gate 132, a delay element 136, and an inverter 134. In operation, the ODS* signal will pulse low each time the CAS* signal goes low. That is, the output of the pulse generator circuit 128 is normally high so that p-channel transistor 124 is activated when the output_enable line is high. The output of the pulse generator is fed back to NAND gate 130 to insure that a full pulse length is realized and so that when CAS* returns high after the pulse the output of NAND gate 130 goes low. When CAS* goes low the output of NAND gate 130 will go high. The output of NAND gate 130 is delayed by delay element 136 so that the inputs to NAND gate 132 are both high and its output goes low. The pulse generator output will return high when the signal delayed by delay element 136 is inverted and reaches NAND gate. As a result, when the pulse generator pulses low, the p-channel transistor 124 is turned off and the n-channel transistor 126 is turned on to pull the ODS* signal low. When the pulse generator output returns high, the ODS* signal will also return high. The length of the active pulse will be determined by delay element 136. It will be understood that an inverter 127 could be included with the trigger circuit, as shown in FIG. 12, to provide an active high ODS signal. The ODS* line and the DQ lines are assumed to be equivalently loaded. This insures that the transition of the ODS* signal is complete at the same time that valid data is present on the DQ lines. Reliance on the time of $t_{CAC}$ to insure the availability of valid data is thereby eliminated.

Figure 13:
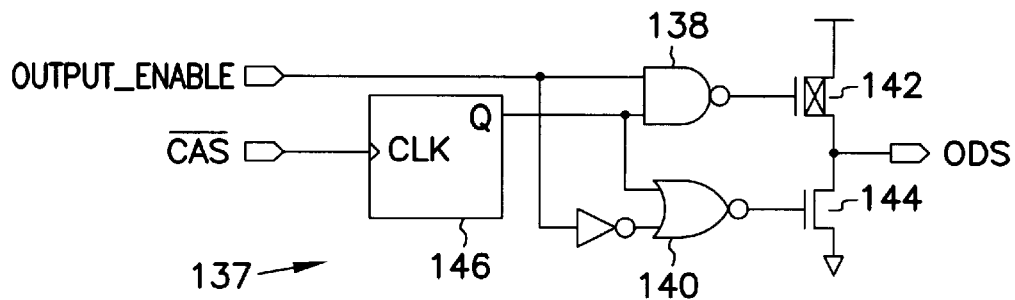
FIG. 13 is a schematic diagram of a trigger circuit for producing the output data strobe of FIG. 6.

FIG. 13 shows a schematic of another trigger circuit 137 which provides an ODS signal that toggles states when valid data is present on the DQ lines, as shown in the timing diagram of FIG. 6. The trigger circuit comprises a NAND gate 138 and a NOR gate 140 to selectively activate pull-up p-channel transistor 142 and pull-down n-channel transistor 144, respectively. The NAND gate has an input coupled to an output_enable signal which is at a high voltage when the output buffers are turned on. The other input to the NAND gate is the Q output of a flip-flop 146. The clock input of the flip-flop is coupled to the CAS* signal so that the Q output toggles with each low transition of the CAS* signal. The inputs of NOR gate 140 are coupled to the inverse of the output_enable signal and the Q output of the flip-flop. In operation, the ODS* signal will transition states when the CAS* signal goes low by either activating n-channel transistor 144 with the output of NOR gate 140 and turning p-channel transistor 142 off, or activating the p-channel transistor 142 while turning the n-channel transistor 144 off. It will be understood that the direction of the transition will depend upon the prior state of the flip-flop. Further, when the output-enable signal is low, both the n-channel and the p-channel transistors are turned off and the ODS signal will be in an undefined state. When output_enable goes high, either transistor 142 or transistor 144 will be activated depending upon the state of the flip-flop. It will be appreciated that an advantage of this trigger circuit is that the ODS signal does not have to operate at the same frequency as the CAS* signal. The microprocessor, therefore, monitors the ODS signal for transitions in its logic state. As with the pulsed ODS signal generated by the circuits of FIGS. 11 and 12, the ODS line of the present implementation is assumed to be loaded to match the load on the DQ lines.

Figure 14:
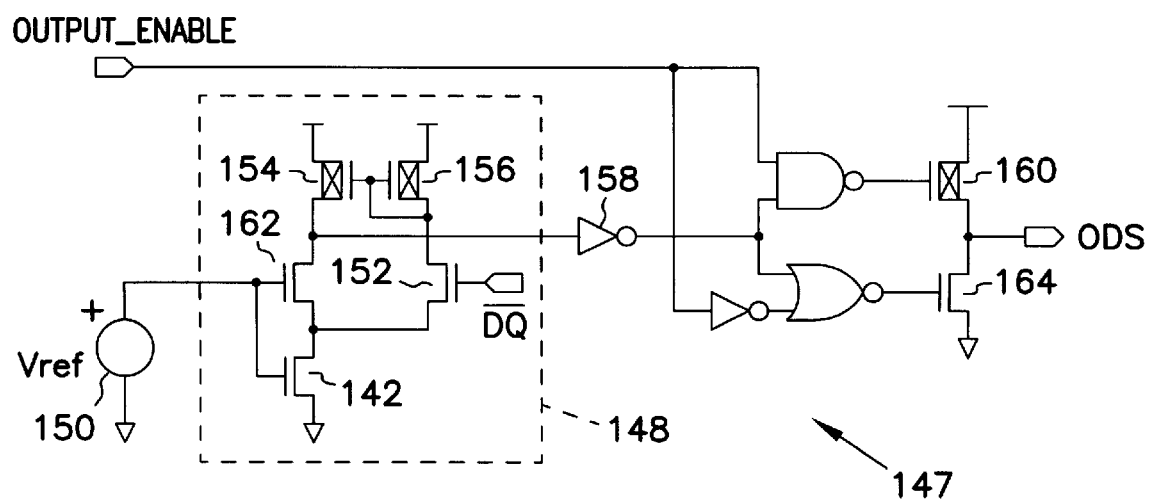
FIG. 14 is a schematic diagram of a trigger circuit for producing the output data strobe of FIG. 4.

An alternate trigger circuit 147 which can be used to generate an ODS signal is illustrated in FIG. 14. This circuit provides an ODS signal based upon the actual state of the DQ lines. A comparitor circuit 148 is used to compare the level of a DQ line to a reference voltage 150, for example 1.5 volts. If the DQ line exceeds the reference voltage, n-channel transistor 152 is activated and pulls the gates of p-channel transistors 154 and 156 low such that the output of inverter 158 goes low. Pull-up p-channel transistor 160, therefore, is de-activated and pull-down transistor 164 pulls the ODS signal low if the output_enable signal is high when the DQ line is high. N-channel transistor 162 is activated when the DQ line decreases below the reference voltage such that pull-up p-channel transistor 160 is activated and pulls the ODS signal high. The ODS signal produced by this circuit, therefore, follows the inverted state of the DQ line. This circuit has the advantage of using the actual state of the DQ lines as the trigger for the ODS signal. However, the ODS signal will not change if the DQ line does not change states. Therefore, circuitry should be provided to monitor all of the DQ lines and provide interim ODS signals which are input into an OR gate to produce a final ODS signal.

It will be understood by those skilled in the art that the above described trigger circuits will produce a ODS signal any time the OE* signal is low and the CAS* cycles low. This could result in erroneous ODS signals if the OE* signal is not carefully controlled. As such additional circuitry can be provided to eliminate unwanted ODS signals. For example, the WE* signal can be used in conjunction with the OE* signal to insure that an ODS signal is not produced during a write operation. Further, a supplemental circuit can be added to eliminate an ODS signal on the first CAS* falling edge of a burst read operation, as shown in FIG. 3. These additional circuits can be included to increase the flexibility of an ODS signal of the present invention.

Figure 15:
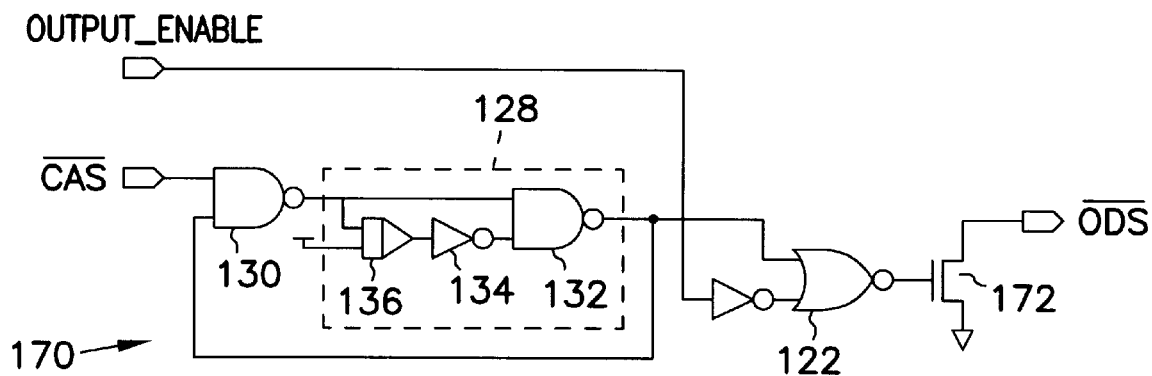
FIG. 15 is a schematic diagram of a trigger circuit for producing an output data strobe signal using an open source transistor.
Figure 16:
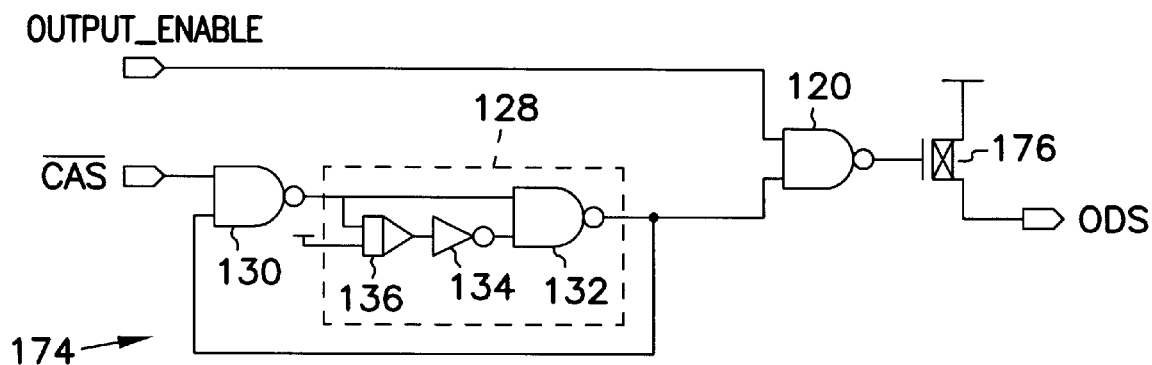
FIG. 16 is a schematic diagram of a trigger circuit for producing an output data strobe signal using an open drain transistor.

FIGS. 15 and 16 illustrate trigger circuit 170 and 174, respectively, which can be used in a wired OR configuration with other memory circuits. Trigger circuit 170 provides an open source pull-down transistor 172. The source of transistor 172 can be coupled to the pull down transistors of other memory circuits. This allows any one of the memory circuits to pull the ODS* signal low. FIG. 16 illustrates a trigger circuit 174 which has an open ended drain output transistor 176. The drain of transistor 176 can be coupled to other open drain output transistors such that each memory has the ability to pull the ODS* signal high. A push-pull output circuit as shown in FIG. 11, therefore, can be used with the present invention or an open ended output circuit can be used.

Figure 17:
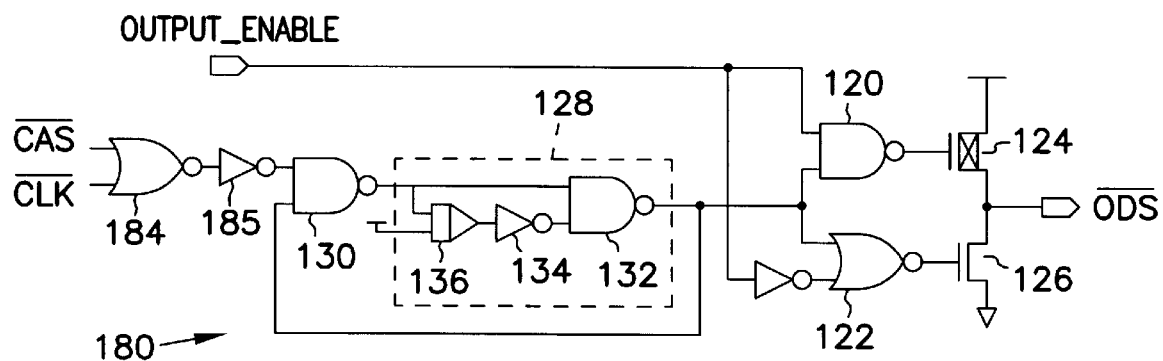
FIG. 17 is a schematic diagram of a trigger circuit for producing the output data strobe of FIG. 7.
Figure 18:
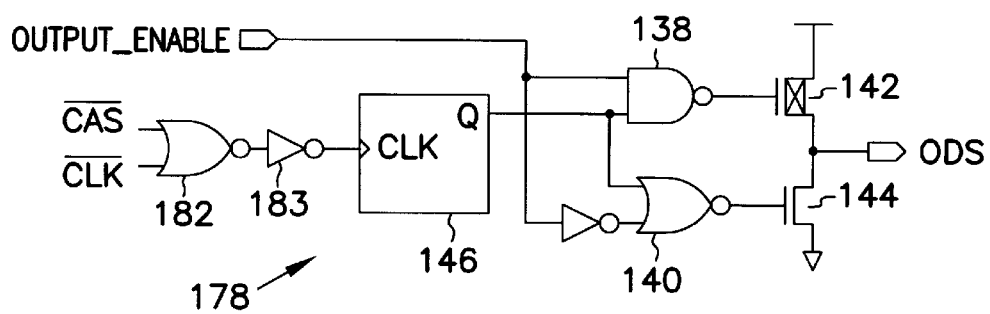
FIG. 18 is a schematic diagram of a trigger circuit for producing the output data strobe of FIG. 10.

FIGS. 17 and 18 illustrate trigger circuits 180 and 178, respectively, which use both the CAS* signal and the clock signal to activate the pulse generator 128 or flip-flop 146. In trigger circuit 178, NOR gate 182 and inverter 183 in combination provide a low signal when both CAS* and clock are low. The trigger circuit generally operates as trigger circuit 137, as described above in reference to FIG. 13. Similarly, in trigger circuit 180, NOR gate 184 and inverter 185 in combination provide a low signal when both CAS* and clock are low. The trigger circuit generally operates as trigger circuit 118, as described above in reference to FIG. 11. These circuits can be used to provide the ODS and ODS* signals shown in FIGS. 7 and 10 for a clocked BEDO memory.

Conclusion

A memory circuit has been described which has an output data strobe signal that indicates when valid data is available on the output lines. The specific signal and circuit used to generate the signal is not critical. Several alternate signals and circuits, therefore, have been described which can be used for the output strobe signal. The output strobe signal is used to speed the reading of data from the output line by allowing a microprocessor, or other external circuit, to read the data from the output lines as soon as it is valid, thereby eliminating the need to wait a specified period of time.

The output data strobe signal has been described as either an active low or active high signal which can be either a pulse of a predetermined length or an active signal during the time that valid data is available on the output lines. Alternatively, the strobe signal has been described as toggling to an opposite state each time new valid data becomes present on the output lines. Output data strobe signals have also been described for use in a clock burst EDO operation. Further, open source and open drain outputs have been described for allowing a plurality of memory circuits to be coupled together in a wired OR configuration.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the output data strobe signal can be included in static or dynamic RAMs, video RAMs, window RAMs, or synchronous DRAMs. Further, the output data strobe signal can be included with DRAM-type interfaces such as floating gate EPROM or flash memory interfaces. Therefore, it is manifestly intended that this invention be limited only by the claims and the equivalents thereof.

What is claimed is:

1. An integrated circuit memory comprising:
   memory cells for storing data;
   data read circuitry for reading and outputting data stored in the memory cells on an external data communication line; and
   an output signal circuit for providing a signal on an external connection indicating that data is available on the external data communication line wherein the output signal circuit comprises a trigger circuit for initiating the signal on the external connection, and the trigger circuit initiates the signal on the external connection in response to an externally provided address signal.

2. The integrated circuit memory of claim 1 wherein externally provided address signal is a delayed column address signal (CAS).

3. The integrated circuit memory of claim 1 wherein the trigger circuit initiates the signal on the external connection in response to a voltage level on the external data communication line.

4. The integrated circuit memory of claim 3 wherein the trigger circuit comprises a compare circuit for comparing an actual voltage on the external data communication line with a predetermined reference voltage.

5. The integrated circuit memory of claim 1 wherein the integrated circuit memory is a synchronous memory device.

6. The integrated circuit memory of claim 1 wherein the output signal circuit comprises a driver circuit for driving the signal on the external connection.

7. The integrated circuit memory of claim 6 wherein the driver circuit comprises a push/pull circuit for coupling the external connection to either a first or second voltage level.

8. The integrated circuit memory of claim 6 wherein the driver circuit comprises a pull-up circuit for coupling the external connection to a first voltage level.

9. The integrated circuit memory of claim 6 wherein the driver circuit comprises a pulldown circuit for coupling the external connection to a first voltage level.

10. The integrated circuit memory of claim 1 wherein the output signal circuit comprises:
    a trigger circuit for initiating the signal on the external connection; and
    a driver circuit for driving the signal on the external connection in response to the trigger circuit during a data read operation.

11. The integrated circuit memory of claim 10 wherein driver circuit is configured to receive an output enable signal such that driver circuit actively drives the signal on the external connection during a data read operation.

12. An integrated memory circuit comprising:
randomly addressable memory cells for storing data;
a plurality of data output lines;
a buffer circuit for coupling the data stored in the randomly addressable memory cells to the plurality of data output lines; and
a trigger circuit which produces a signal coupled to an external connection indicating that data is available on the plurality of output data lines, wherein the trigger circuit is responsive to an address strobe signal during a read operation.

13. The integrated circuit memory of claim 12 wherein the signal is a pulse.

14. The integrated circuit memory of claim 12 further comprising a driver circuit for driving the signal on the external connection in response to the trigger circuit.

15. An integrated memory circuit comprising:
randomly addressable memory cells for storing data;
a plurality of data output lines;
a buffer circuit for coupling the data stored in the randomly addressable memory cells to the plurality of data output lines; and
a trigger circuit which produces a signal coupled to an external connection indicating that data is available on the plurality of output data lines,
wherein the trigger circuit is responsive to a column address strobe signal and an output enable signal.

16. A data processing system comprising:
a microprocessor; and
a memory device coupled to the microprocessor, the memory device comprising:
memory cells for storing data,
data read circuitry for reading and outputting data stored in the memory cells on an external data communication line coupled to the microprocessor, and
an output signal circuit for providing a data strobe signal on an external connection coupled to the microprocessor indicating that data is available on the external data communication line, whereby the microprocessor monitors the data strobe signal and retrieves data from the external data communication line in response to the output data strobe signal, wherein the data strobe signal is coupled to the external data communication line through a push/pull driver circuit.

17. The data processing system of claim 16 wherein the memory device is a dynamic random access memory circuit (DRAM).

18. The data processing system of claim 16 wherein the memory device is a static random access memory circuit (SRAM).

19. The data processing system of claim 16 wherein the memory device is a synchronous dynamic random access memory circuit (SDRAM).

20. The data processing system of claim 16 wherein the memory device is a synchronous static random access memory circuit (SSRAM).

21. A data processing system comprising:
a microprocessor: and
a memory device coupled to the microprocessor, the memory device comprising:
memory cells for storing data,
data read circuitry for reading and outputting data stored in the memory cells on an external data communication line coupled to the microprocessor, and
an output signal circuit for providing a data strobe signal on an external connection coupled to the microprocessor indicating that data is available on the external data communication line, whereby the microprocessor monitors the data strobe signal and retrieves data from the external data communication line in response to the output data strobe signal,
wherein the data strobe signal is coupled to the external data communication line through a pull-up driver circuit.

22. A method of reading a memory circuit, the method comprising:
receiving an external signal requesting data output from the memory circuit;
coupling data stored in the memory circuit to output communication lines;
generating an output data signal on an external connection to indicate that data is coupled to the output communication lines;
receiving the output data signal with a microprocessor; and
latching the data coupled to the output communication lines.

23. The method of claim 22 wherein the output data signal is an active low pulse.

24. The method of claim 22 wherein the output data signal is an active high pulse.

25. A method of reading a memory circuit, the method comprising:
receiving an external signal requesting data output from the memory circuit;
coupling data stored in the memory circuit to output communication lines; and
generating an output data signal on an external connection to indicate that data is coupled to the output communication lines,
wherein the output data signal toggles logic states when new data is available on the output communication lines.

26. A method of reading a memory circuit, the method comprising:
receiving an external signal requesting data output from the memory circuit;
coupling data stored in the memory circuit to output communication lines; and
generating an output data signal on an external connection to indicate that data is coupled to the output communication lines,
wherein generating an output data signal comprises:
receiving an address strobe signal;
generating a delayed pulse signal from the address strobe signal;
pulsing the output data signal low during a read operation in response to the delayed pulse signal; and
coupling the output data signal to the external connection.

27. A method of reading a memory circuit, the method comprising:
receiving an external signal requesting data output from the memory circuit;

coupling data stored in the memory circuit to output communication lines; and generating an output data signal on an external connection to indicate that data is coupled to the output communication lines, wherein generating an output data signal comprises:
receiving an address strobe signal;
generating a delayed pulse signal from the address strobe signal;
receiving a clock signal;
pulsing the output data signal to an active state during a read operation in response to the delayed pulse signal and the clock signal; and
coupling the output data signal to the external connection.

28. A method of reading a memory circuit, the method comprising:

receiving an external signal requesting data output from the memory circuit;

coupling data stored in the memory circuit to output communication lines; and generating an output data signal on an external connection to indicate that data is coupled to the output communication lines, wherein generating an output data signal comprises:
receiving an address strobe signal;
toggling the output data signal to an opposite logic state during a read operation in response to the address strobe signal; and
coupling the output data signal to the external connection.

29. A method of reading a memory circuit, the method comprising:

receiving an external signal requesting data output from the memory circuit;

coupling data stored in the memory circuit to output communication lines; and generating an output data signal on an external connection to indicate that data is coupled to the output communication lines, wherein generating an output data signal comprises:
receiving an address strobe signal;
receiving a clock signal;
toggling the output data signal to an opposite logic state during a read operation in response to the address strobe signal and the clock signal; and
coupling the output data signal to the external connection.

30. A method of reading a memory circuit, the method comprising:

receiving an external signal requesting data output from the memory circuit;

coupling data stored in the memory circuit to output communication lines; and generating an output data signal on an external connection to indicate that data is coupled to the output communication lines, wherein generating an output data signal comprises:
comparing a voltage level of an output communication line with a predetermined voltage level;
generating an internal signal if a voltage on the output communication line is greater than the predetermined voltage level; and
generating the output data signal in response to the internal signal.

* * * * *